United States Patent
Opsahl et al.

[11] Patent Number: 5,903,194
[45] Date of Patent: May 11, 1999

[54] DIGITAL PHASE MODULATION OF FREQUENCY SYNTHESIZER USING MODULATED FRACTIONAL DIVISION

[75] Inventors: Paul L. Opsahl; Rodney L. Mickelson, both of Cedar Rapids, Iowa

[73] Assignee: Rockwell Science Center, Inc., Thousand Oaks, Calif.

[21] Appl. No.: 08/906,413

[22] Filed: Aug. 5, 1997

[51] Int. Cl.[6] ........................................ H03L 7/08
[52] U.S. Cl. ..................... 331/1 A; 331/16; 327/107; 327/115; 377/48; 332/127; 455/76; 455/112
[58] Field of Search ................... 331/1 A, 17, 16; 327/105, 107, 115, 117; 377/48, 47; 332/127, 144; 455/76, 119, 112, 113

[56] References Cited

U.S. PATENT DOCUMENTS 5,021,754  6/1991  Shepherd et al. .................. 332/128
5,038,117  8/1991  Miller ................................ 331/16

*Primary Examiner*—Arnold Kinkead
*Attorney, Agent, or Firm*—Kyle Eppele; James P. O'Shaughnessy

[57] ABSTRACT

A phase-locked loop frequency synthesizer system is provided using fractional frequency division and a fractional control number for phase modulating an output of the frequency synthesizer using an incoming information signal. The apparatus includes a delta-sigma converter which adjusts a divisor of the frequency divider by operating upon a magnitude modulated fractional frequency control number. The system further includes a differentiator which provides the magnitude modulated input stream to the delta-sigma modulator by modulating the fractional control number with detected differences in the incoming information signal.

11 Claims, 5 Drawing Sheets

PHASE MODULATION SIGNAL ALIGNMENT DIAGRAM

| | INTEGER FREQUENCY | | | | | | FRACTIONAL FREQUENCY | | | | | | | |
|---|---|---|---|---|---|---|---|---|---|---|---|---|---|---|
| $f_k =$ | $f_{33}$ | $f_{32}$ | $f_{31}$ | · | · | · | $f_{23}$ | $f_{22}$ | $f_{21}$ | · | · | $f_8$ | $f_7$ | · | · | $f_3$ | $f_2$ | $f_1$ | $f_0$ |
| $f_k =$ | $f_{33}$ | $f_{32}$ | $f_{31}$ | · | · | · | $f_{23}$ | $f_{22}$ | $f_{21}$ | · | · | $f_8$ | $f_7$ | · | · | $f_3$ | $f_2$ | $f_1$ | $f_0$ |
| $d_k =$ | $d_{23}$ | $d_{23}$ | $d_{23}$ | · | · | · | $d_{23}$ | $d_{22}$ | $d_{21}$ | · | · | $d_8$ | 0 | · | · | 0 | 0 | 0 | 0 |

SIGN EXTENDED MOST SIGNIFICANT BIT   |   16-BIT DIFFERENTIATED PHASE MODULATION SIGNAL

Fig. 4

DIGITAL PHASE MODULATION OF FREQUENCY SYNTHESIZER USING MODULATED FRACTIONAL DIVISION

FIELD OF THE INVENTION

The field of the invention relates to frequency synthesizers and more particularly to frequency synthesizers using fractional N techniques.

BACKGROUND OF THE INVENTION

Frequency synthesizers are generally known. As known, a frequency synthesizer is a device which generates an output frequency that is typically an integer multiple of a reference frequency. Such devices have wide application in communication systems in transmitters and receivers as a means for changing a transmitting or receiving channel.

A commonly known frequency synthesizer uses a phase locked loop (PLL), where an output signal is compared with a reference signal and the phase difference used to control the output. A voltage controlled oscillator (VCO) is used to generate the output signal. A frequency divider is used to divide the frequency of the output signal by some integer value. The divided signal is then compared with a reference signal in a phase comparator. The output of the phase comparator is scaled, low-pass filtered and applied as a frequency controlling input to the VCO.

Recent innovations have included the development of fractional frequency dividers. The development of fractional frequency dividers has dramatically improved the utility of frequency synthesizers. In the past, a PLL frequency synthesizer could only synthesize frequencies that were an integer multiple of the reference frequency. The development of a fractional divider now means that virtually any frequency can be provided by any PLL frequency synthesizer using a fractional divider.

While the name "fractional frequency divider" suggests division by some fractional value, the actual division is fractional only in terms of an average value. To accomplish fractional frequency division, a divisor within the fractional frequency divider is incrementally changed over the course of a timing interval in such a way as to correct for the fractional differences caused by integer division.

In practice, a fractional frequency divider may include an integer divider, a summer and a delta-sigma converter. The divider divides the frequency of an incoming signal based upon some fractional control number N.F. The fractional control number is in turn made up of an integer portion N and a fractional portion F. The delta-sigma converter receives the fractional portion as an input and provides a series of integer value corrections as an output. The integer value corrections are summed with the integer portion in the summer and the result used as the divisor for fractional frequency division.

The output signal of the fractional frequency divider is then compared with a reference signal in a phase comparator. Any phase difference detected in the phase comparator is scaled and low-pass filtered. The scaled, low-pass filtered difference signal may then be applied to a VCO to achieve the desired synthesized frequency.

While frequency synthesizers using fractional frequency dividers are effective in fixed frequency applications, there are many situations where a modulation scheme also requires phase control. Accordingly a need exists for a method of imposing phase control on a frequency synthesizer using fractional frequency division.

SUMMARY

A phase-locked loop frequency synthesizer system is provided using fractional frequency division and a fractional control number for phase modulating an output of the frequency synthesizer using an incoming information signal. The apparatus includes a delta-sigma converter which adjusts a divisor of the frequency divider by operating upon a magnitude modulated fractional control number. The system further includes a differentiator which provides the magnitude modulated fractional control number to the delta-sigma modulator by modulating the fractional control number with detected differences in the incoming information signal.

BRIEF DESCRIPTION OF THE DRAWINGS

FIG. 4 depicts a signal alignment diagram for an example of bit addition under the block diagram of FIG. 1;

DETAILED DESCRIPTION

Figure 1:
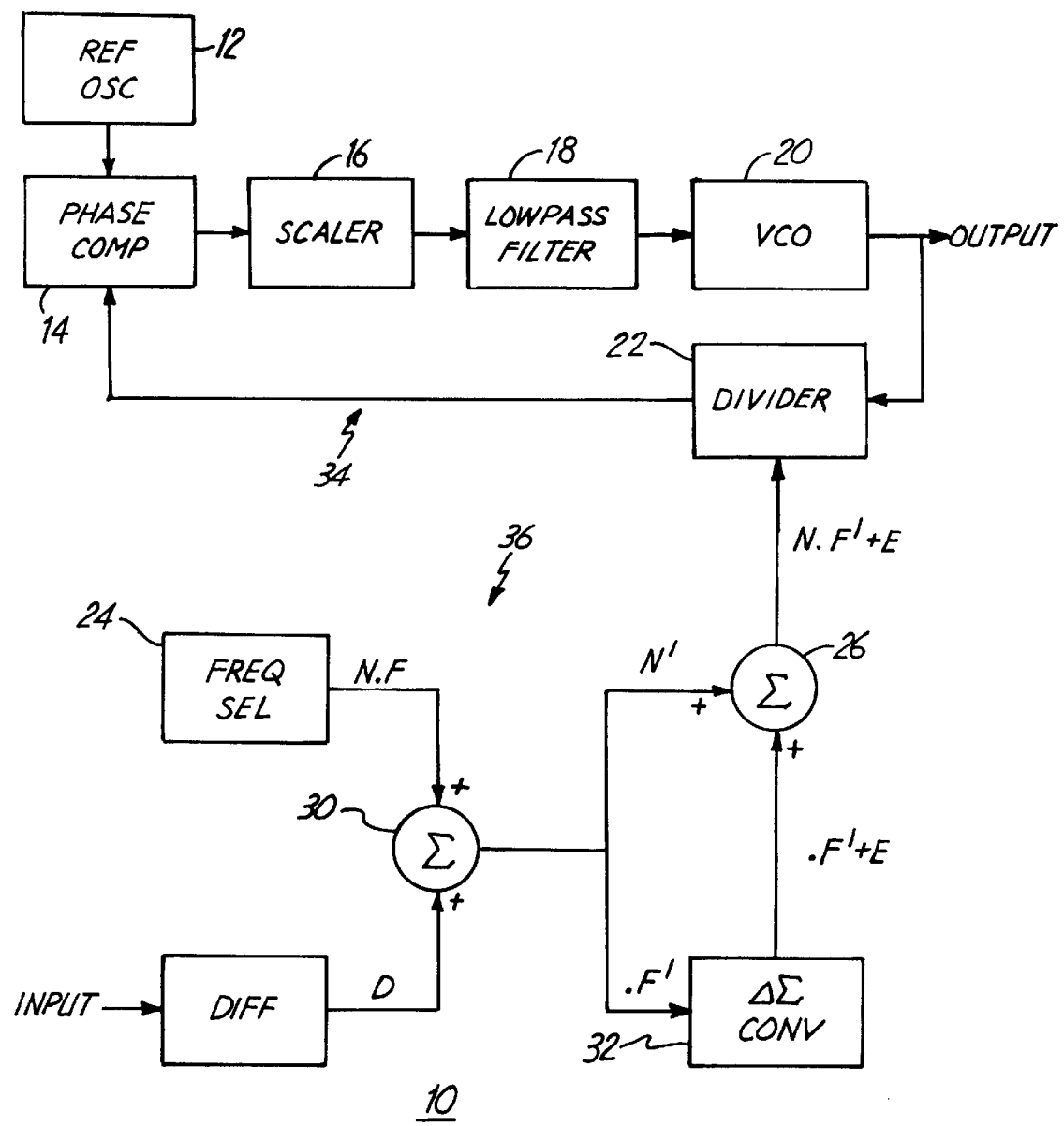
FIG. 1 is a block diagram of a phase modulated fractional frequency divider in accordance with an embodiment of the invention.

FIG. 1 is a block diagram of a specific example of a phase modulated communication system 10, generally, in accordance with an embodiment of the invention. Included within the system 10 is a PLL frequency synthesizer section 34 and a modulation control section 36.

Under the embodiment, the PLL synthesizer 34 includes a VCO 20 operating under the control of a reference oscillator 12 and feedback signal from a divider 22. Frequency control of the PLL synthesizer 34 is accomplished by dividing an output frequency of the PLL synthesizer 34 by a divisor within the divider 22. A phase difference between an output of the divider 22 and reference oscillator 12 is detected within a phase comparator 14, scaled within a scaler 16, low-pass filtered in a filter 18 and applied as a frequency control signal to the VCO 20.

Phase modulation is accomplished under a four-step process. First an input signal is differentiated within a differentiator 28 to detect variations from one data word to the next. Variations may be any level change in a multi-bit (e.g., 16 bit) word of a digitized information stream.

Next the detected difference is scaled and added to the fractional frequency control number to produce a phase modulated fractional control number. Scaling in this context means lateral shifting of the differentiated value within a register such that the bits (e.g., 16) of the differentiated word are added to the proper bit locations (e.g., bit locations 8–23) of the control numbers. A sign extension is also performed on the differentiated value before addition to the control numbers.

The fractional portion of the sum is applied as an input to a delta-sigma converter 32. The output of the delta-sigma converter 32 represents an error correcting value which is used to adjust the divisor used by the divider 22. Under the embodiment the error value is added to the integer portion of the fractional frequency control number in the adder 26. The sum is used as the divisor for frequency division within the divider 22 to accomplish phase modulation.

Figure 2:
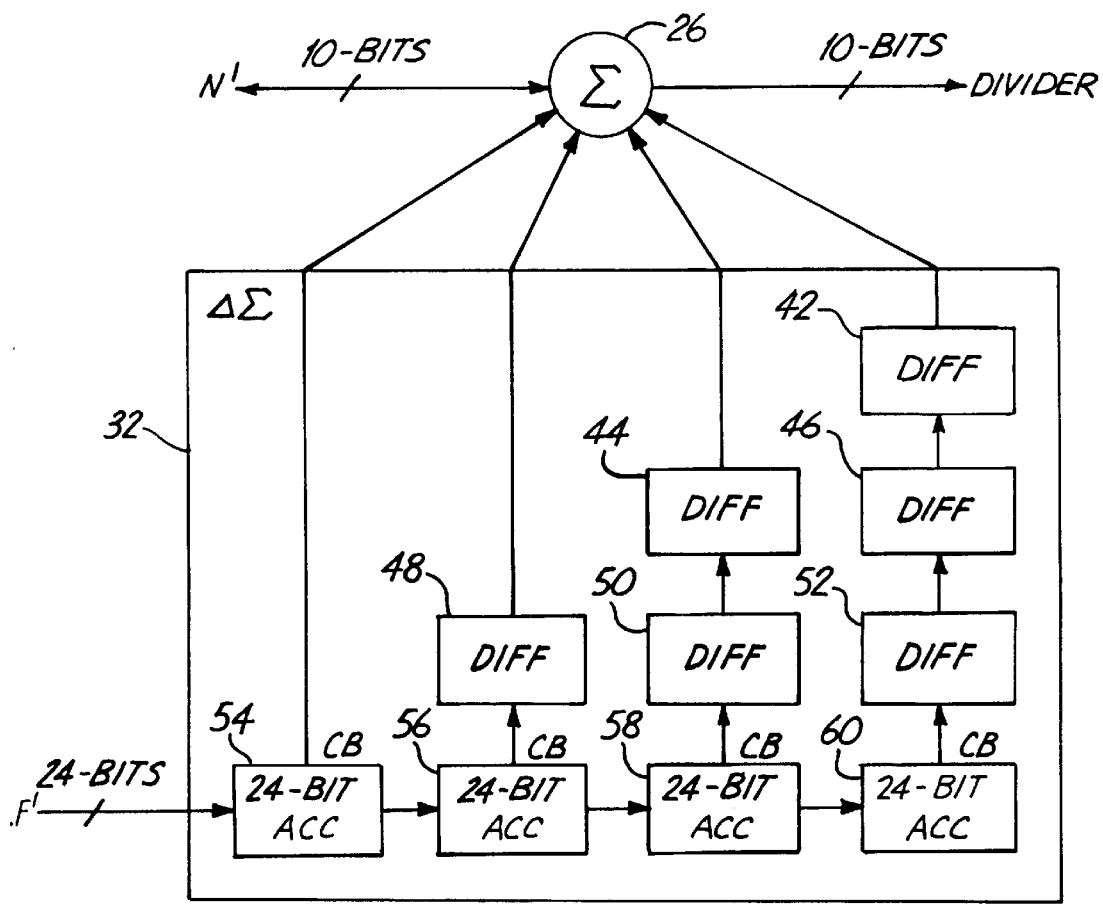
FIG. 2 is a block diagram of one embodiment of the adder and delta-sigma converter of FIG. 1.

FIG. 2 is a block diagram of the sigma-delta converter 32 under an embodiment of the invention. For a 24 bit fractional portion, four 24-bit accumulators 54, 56, 58, 60 are used for fourth order sigma-delta modulation.

For the first accumulator 54, the carry bit (CB) is added directly to the integer portion within the adder 26. For each subsequent accumulator 56, 58, 60, the carry bit is incrementally differentiated within differentiators 42, 44, 46, 48, 50, 52 of the MASH structure shown. The differentiated carry bits of each subsequent accumulator 56, 58, 60 is added along with the carry bit of the first accumulator 54 to provide the divisor for the next calculation cycle.

Figure 3:
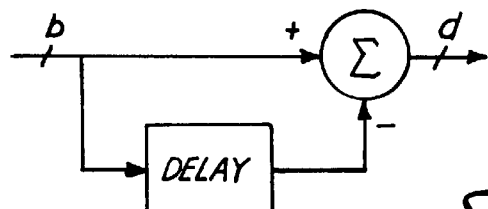
FIG. 3 is a block diagram of a specific embodiment of the differentiator of FIG. 2.

FIG. 3 is a block diagram of a specific implementation of the differentiators 42, 44, 46, 48, 50, 52. As shown, for a constant input the output remains zero. For a varying input signal, the output signal amplitude is equal to the amplitude differences of successive input samples. The number of bits going in (b) and bits coming out (d) depend on the signal characteristics.

FIG. 4 is a graphical representation of modulation weighting under one embodiment. As shown, a 16 bit differentiated modulation value may be created by the differentiator 28. Differentiation of the incoming information signal may be accomplished using a structure similar to that shown in FIG. 3. Under the embodiment, the 16 bit differentiated modulation value is added to bits 8 through 23 of the fractional frequency control number. The addition of the differentiated value to the fractional control number provides a magnitude modulated fractional control number for processing by the summer 26 and delta-sigma converter 32.

Figure 5:
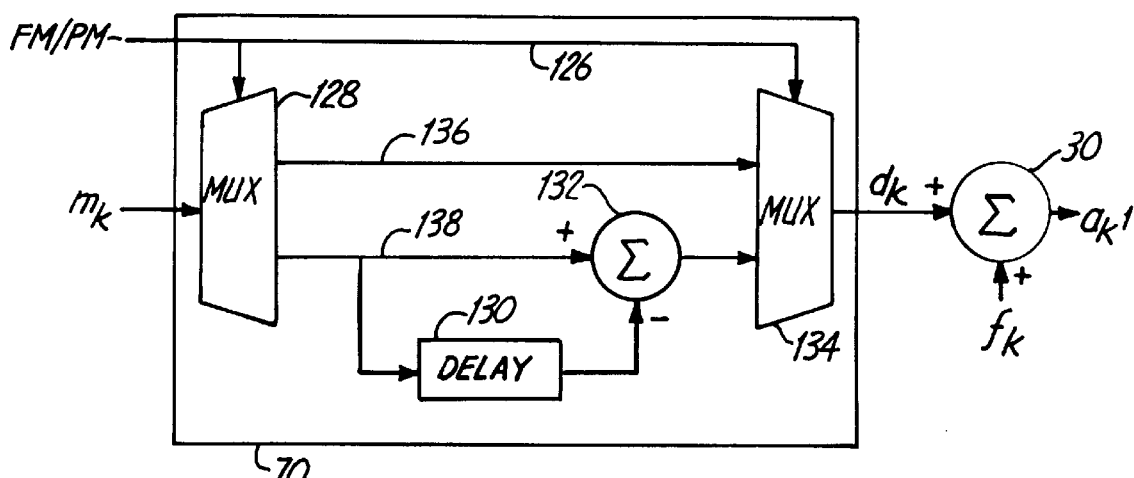
FIG. 5 is a block diagram of an embodiment of apparatus for phase modulating or frequency modulating the phase locked loop of FIG. 1 under an alternate embodiment of the invention.

FIG. 5 is a simplified schematic of a circuit 70 for accomplishing either frequency modulation (FM) or phase modulation under another embodiment of the invention. The circuit 70 is intended to be used in place of the differentiator 28 of FIG. 1. Under the embodiment, frequency modulation is accomplished by placing a logical "1" on control line 126 and adding a modulation value $m_k$ directly to the fractional frequency control number $f_k$ along circuit path 136. The frequency modulated fractional portion of the fractional frequency control number is then passed to the delta-sigma converter 32.

Phase modulation is accomplished by imposing a logical "0" on the control line 126. Where phase modulation is desired the modulation signal $m_k$ is routed by a first multiplexer 128 along a second circuit path 138, through delay element 130 and differencer 132. The difference signal $d_k$ is added to the fractional control number and processing continues as described above.

Figure 6:
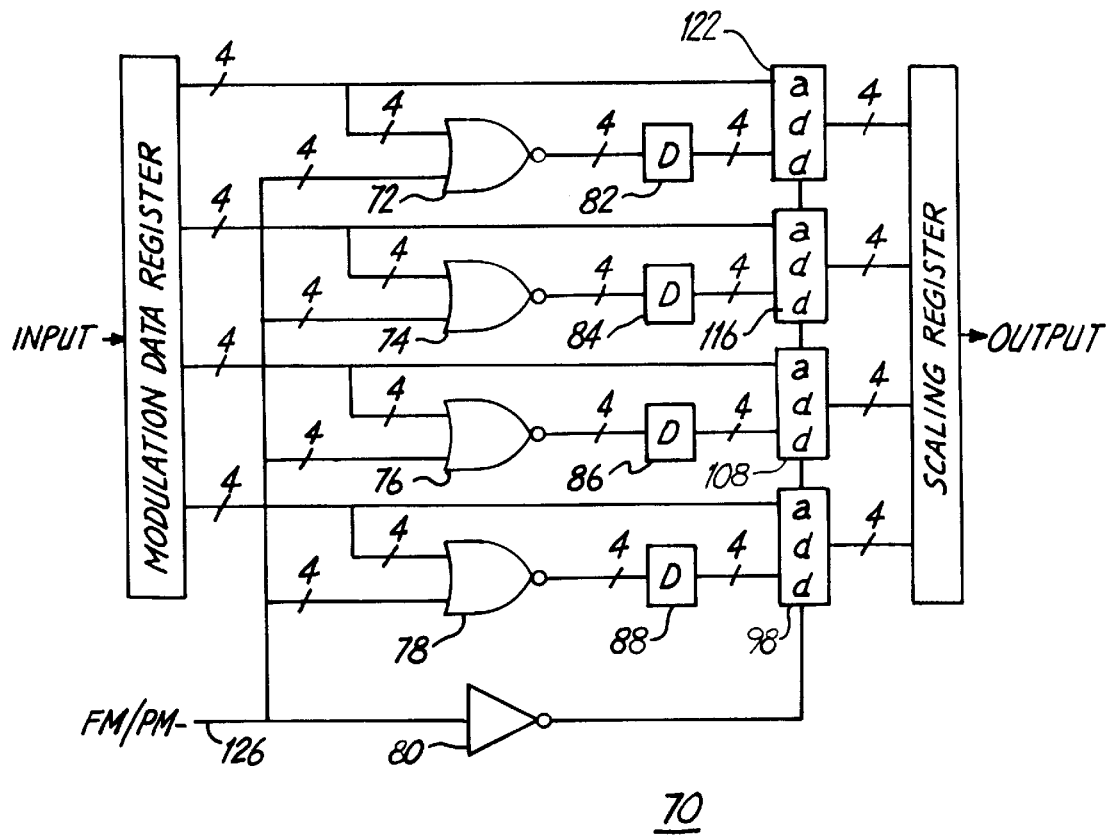
FIG. 6 is a block diagram of a particular structure for implementing the teachings of FIG. 5.

FIG. 6 is a practical example of a circuit 70 of FIG. 5. FIG. 6 includes as circuit elements: an inverter 80; latches (delay elements) 82, 84, 86, 88; 4-bit adders 98, 108, 116, 122; and "NOR" gates 72, 74, 76, 78.

When a logical "1" is placed on control line 126, the second input of each adder 98, 108, 116, 122 is disabled. Disabling the second input causes the modulating signal $m_k$ to pass straight through without modification. The modulating signal $m_k$ is added to the frequency control number and the system 10 frequency modulates the output signal.

When a logical "0" is placed on the control line 126, a two's complement addition is realized by the inverting action of the "NOR" gates, and the presence of a logical "1" at the carry input of the adder 98. Since the second input is enabled by the action of the "NOR" gates, and has an additional step of delay, the circuit emulates the previously described differentiator 28.

A specific embodiment of a method and apparatus of modulating a frequency synthesizer using fractional frequency control according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

We claim:

1. A phase-locked loop frequency synthesizer system using fractional frequency division and a fractional control number for phase modulating an output of the frequency synthesizer using an incoming information signal, such apparatus comprising:

a delta-sigma converter which adjusts a divisor of a frequency divider by operating upon a magnitude modulated fractional control number;

a differentiator which detects differences in the incoming information signal by differentiating the incoming information signal; and a first summer which produces the magnitude modulated fractional control number by combining an output of the differentiator with an unmodulated fractional control number.

2. The phase-locked loop frequency synthesizer system as in claim 1 further comprising the frequency divider.

3. The phase-locked loop frequency synthesizer system as in claim 2 further comprising a voltage controlled oscillator coupled to a frequency dividing input of the frequency divider.

4. The phase-locked loop frequency synthesizer system as in claim 3 further comprising a phase comparator for comparing a phase of the output of the frequency divider against a phase of a reference frequency and which generates a difference voltage as an output for control of the voltage controlled oscillator.

5. The phase-locked loop frequency synthesizer system as in claim 4 further comprising a reference oscillator which provides the reference signal against which the phase of the output of the frequency divider is compared.

6. The phase-locked loop frequency synthesizer system as in claim 5 wherein the phase-locked loop frequency synthesizer further comprises a low pass filter coupled between the phase comparator and voltage controlled oscillator.

7. The phase-locked loop frequency synthesizer system as in claim 1 further comprising a second summer which adjusts the divisor by combining an output of the delta-sigma converter with an integer portion of the magnitude modulated fractional control number.

8. Apparatus for phase modulating a frequency synthesizer output signal using an incoming information signal, such apparatus comprising:

a phase-locked loop frequency synthesizer operating under control of a frequency divider;

a summer which provides a divisor to the frequency divider by combining an integer portion of a magnitude modulated fractional control number and a delta-sigma modulated fractional portion of the magnitude modulated fractional control number;

a delta-sigma converter which provides the delta-sigma modulated fractional portion of the magnitude modulated fractional frequency control number to the summer by operating upon the fractional portion of the magnitude modulated fractional control number;

a second summer which provides the fractional portion of the magnitude modulated fractional control number to the delta-sigma modulator and the integer portion to the first summer by combining the fractional control number with a phase modulation value;

a differentiator which provides the phase modulation value to the second summer to magnitude modulate the fractional control number by differentiating the incoming information signal; and a multiplexer which selects the phase modulated value of the differentiated incoming information signal for application to the second summer to phase modulate the incoming signal.

9. Apparatus for phase modulating an output of a frequency synthesizer with an information signal, such apparatus comprising:

a frequency synthesizer comprising:
a voltage controlled oscillator;
a frequency divider which divides an output of the voltage controlled oscillator down to a divided signal based upon a divisor; and
a phase comparator which compares the divided signal with a reference signal and which provides a control signal to the voltage controlled oscillator based upon a phase difference between the divided signal and the reference signal;

a summer which generates the divisor for use in the frequency divider by combining an integer portion of a magnitude modulated fractional control number and integer value corrections;

a delta-sigma converter which generates the integer value corrections by operating upon a fractional portion of the magnitude modulated fractional control number received at an input;

a second summer which generates a phase modulated fractional control signal by combining an unmodulated control number with a differentiated information signal; and a differentiator which generates the differentiated information signal by differentiating the information signal.

10. A method of phase modulating an output in a radio frequency transmitter having a phase-locked loop for frequency control and a frequency divider in a feedback loop of the phase-locked loop and a delta-sigma converter providing an integer value correction for adjusting a divisor of the frequency divider, such method comprising the steps of:

differentiating an information signal to produce a difference value; and adding the difference value to an unmodulated fractional control number to produce a modulated fractional control number;

modulating an input of the delta-sigma converter with the modulated fractional control number to provide the integer correction value.

11. The method as in claim 10 further comprising combining an output of the delta-sigma converter with an integer portion of the modulated fractional control number.

\* \* \* \* \*